United States Patent [19]

Hakim

[11] Patent Number: 4,699,082
[45] Date of Patent: Oct. 13, 1987

[54] APPARATUS FOR CHEMICAL VAPOR DEPOSITION

[75] Inventor: M. Javid Hakim, Burlington, Canada

[73] Assignee: Liburdi Engineering Limited, Hamilton, Canada

[21] Appl. No.: 864,139

[22] Filed: May 16, 1986

Related U.S. Application Data

[63] Continuation-in-part of Ser. No. 688,322, Jan. 3, 1985, abandoned, which is a continuation-in-part of Ser. No. 577,225, Feb. 6, 1984, abandoned, which is a continuation-in-part of Ser. No. 469,857, Feb. 25, 1983, abandoned.

[51] Int. Cl.$^4$ ............................................. C23C 16/00
[52] U.S. Cl. ...................... 118/716; 118/50.1; 118/717; 118/719; 118/725; 118/726; 118/728
[58] Field of Search ............... 118/719, 726, 717, 725, 118/728, 715, 716; 427/253, 255.2, 252

[56] References Cited

U.S. PATENT DOCUMENTS

| | | |
|---|---|---|
| 2,962,399 | 11/1960 | Ruppert et al. . |
| 3,368,914 | 2/1968 | Darnell et al. ................. 427/253 X |
| 3,464,843 | 9/1969 | Basche ........................... 427/253 X |
| 3,486,927 | 12/1969 | Gauje ................................... 427/253 |
| 3,617,359 | 11/1971 | Wakefield ........................ 427/253 |
| 3,637,422 | 1/1972 | Landinham et al. . |
| 3,654,895 | 4/1972 | Bloom et al. . |
| 3,656,995 | 4/1972 | Reedy . |
| 3,721,577 | 3/1973 | Woerner . |
| 3,784,402 | 1/1974 | Reedy . |
| 3,888,705 | 6/1975 | Fletcher . |
| 3,959,557 | 5/1976 | Berry . |
| 4,196,233 | 4/1980 | Bitzer . |
| 4,299,861 | 11/1981 | Dietrich et al. . |

FOREIGN PATENT DOCUMENTS

| | | |
|---|---|---|
| 731990 | 6/1955 | United Kingdom . |
| 773702 | 5/1957 | United Kingdom . |
| 1519699 | 8/1978 | United Kingdom . |

OTHER PUBLICATIONS

Chemical Abstracts, vol. 98, No. 6, 1983, p. 698.
PODOB, Mark, "CVD Hard Coatings Lengthen Tool Life", Metal Progress, pp. 50–52, May. 1982.
Journal Of Materials Science, $TiC_x$–TiN Films Obtained by CVD In An Ultrasonic Field, T. Takahashi, H. Itoh, vol. 14, 1979, pp. 1285–1290.
Journal Of Material Science, Study of Growth Rate and Failure Mode Of Chemically Vapour Deposited TiN, $TiC_xN_y$ and TiC On Cemented Tungsten Carbide, J. S. Cho, S. W. Nam, J. S. Chun, vol. 17, 1982, pp. 2495–2502.

Primary Examiner—Bernard D. Pianalto
Attorney, Agent, or Firm—Stevens, Davis, Miller and Mosher

[57] ABSTRACT

An apparatus for the chemical vapor deposition on substrates of coatings comprising compounds of a titanium sub-group of metals, the vanadium sub-group of metals and the chromium sub-group of metals at temperatures in the range of 250° to 850° C. is disclosed. Sub-halides, such as $TiCl_3$, are reacted with $N_2$ and $H_2$ and thermodynamic and kinetic parameters are manipulated by flow rates and partial pressures of the reactants to achieve the deposition reaction in the temperature range of 250° to 850° C.

24 Claims, 8 Drawing Figures

APPARATUS FOR CHEMICAL VAPOR DEPOSITION

RELATED APPLICATIONS

This application is a continuation-in-part of application Ser. No. 688,322, filed Jan. 3, 1985, now abandoned, which in turn is a continuation-in-part of application Ser. No. 577,225, filed Feb. 6, 1984, now abandoned, which in turn is a continuation-in-part of application Ser. No. 469,857, filed Feb. 25, 1983, now abandoned.

FIELD OF THE INVENTION

This invention relates to chemical vapor deposition of compounds of the titanium sub-group of elements and applies in addition to the vanadium sub-group and chromium sub-group of elements as coatings on a chosen substrate at low temperatures. It also relates to a metal compound coated article. Apparatus for performing the method and for making the article is disclosed.

Such coatings can have various uses when applied to a substrate. For example, coatings of the titanium sub-groups are desirable on metalworking tools to increase the useful life of the tool. Others, such as niobium nitride coatings, are useful as a super conductive material.

BACKGROUND ART

Depending upon the use to which the coating is to be put or the substrate on which the coating is put, the temperature at which a coating can be deposited may be important. Critical temperatures are often involved, above which the properties of the substrate are altered.

For coating drills and machine tools with compounds of the titanium sub-group of elements to lengthen the useful life of the tool, nitrides, carbides and carbonitrides of titanium metal are desirable coatings. Compounds, such as titanium nitride, can be deposited as coatings by chemical vapor deposition (CVD) at temperatures of about 1000° C. or higher.

However, most tool steels are hardened and tempered; and, if temperatures exceeding the tempering temperatures are used, the tools lose their temper and must be reheat treated. When reheat treated, distortion becomes a problem and tool tolerance are affected. Thus, it is preferable to carry out any coating deposition at temperatures below the softening point of the tool metal in order to avoid affecting the temper of the tool steel.

The coating of metalworking tools with titanium nitride is a typical example of a coating situation in which low temperature deposition of the coating is desirable. Present processes deposit titanium nitride by chemical vapor deposition by passing titanium tetrachloride, nitrogen and hydrogen over the substrate at temperatures of about 1000° C. or higher. Other existing processes, also operating in the range of 1000° C., add a hydrocarbon gas, such as methane, to include titanium carbide in the coating deposit. These temperatures have detrimental effects on tool steel temper. Reheat treating to reestablish temper detrimentally affects tolerances. For example, tempered steel will soften about 500° to 600° C., stainless steel will sensitize above 550° C. and nickel-based super alloys overage above 600° C.

It has been found that low deposition temperatures below the temper temperatures of such metals can be used to deposit metal compound coatings of the type discussed above by utilizing sub-halide compounds of the metal in question in the deposition reaction. The phrase metal sub-halides refers to metal halides in which the metal exhibits a valency state (oxidation state) lower than the maximum valency state known for that metal. For example, the maximum valency for titanium is 4, that is, $TiCl_4$. Therefore, the halide compounds of $TiCl_3$ and $TiCl_2$, where titanium exhibits a valency of 3 and 2, respectively, are titanium sub-halides and, in particular, titanium sub-chlorides. Similarly, where the maximum valency state of the metal is 5, any halide compound of that metal, wherein the metal exhibits a valency lower than 5, would be a sub-halide of that metal.

In Canadian Pat. No. 1,087,041, the deposition of hafnium carbide and hafnium nitride coatings by chemical vapor deposition is discussed. At that time, temperatures typically in the neighborhood of 1300° C. were required to produce hafnium coatings by chemical vapor deposition. That patent discloses the use of the sub-halides of hafnium in the deposition process, and thereby achieves temperatures as low as 900° C. in the deposition reaction. However, as discussed above, 900° C. is still above the temper loss point for many alloys that it is desirable to coat.

Low pressure CVD is disclosed by Barron et al, *Vacuum Systems for Plasma Etching, Plasma Deposition and Low Pressure CVD*, Solid State Technology (September 1978) and Jensen, *Modelling of Chemical Vapor Deposition Reactors*, 9th International Conference in Chemical Vapor Definition (May 7-10, 1984), which are hereby incorporated by reference.

SUMMARY OF THE INVENTION

This invention relates to an apparatus for producing metal compound coatings comprising: a reaction area containing particles of the metal compound to be produced; means for providing a controlled flow of a hydrogen halide gas to said reaction area; means for providing a controlled flow of a suitable carrier gas to said reaction area; means for heating said metal particles to a temperature sufficient to cause a reaction and to produce gaseous metallic halides; a coating chamber containing a substrate to be coated; means for providing a controlled flow of gases including the gaseous metallic halide; means for mixing all said gases and for introducing the resulting mixture to said coating chamber; means for heating said substrate to a temperature sufficient to cause deposition of said metal compound on said substrate; and, means for controlling the pressure within said coating chamber.

This invention also relates to a coating apparatus comprising: coating chamber means having inlet means and outlet means and having heating means; halogenation chamber means connected to the coating chamber means having inlet means and reaction heating means; means for isolating the halogenation chamber means from the coating chamber means, the isolation means being removable; particle container means in the halogenation chamber means; and, access means for the coating chamber means.

This invention further relates to an apparatus for producting metal coatings comprising: coating chamber means having carrier gas inlet means and gas outlet means and having substrate heating means for heating a substrate to metal sub-halide coating temperature; halogenation chamber means connected to the coating chamber means having a halogenation gas inlet means and having reaction heating means for causing reaction producing gaseous metallic sub-halides; isolation means for interrupting the connection between the reaction chamber and the halogenation chamber, the isolation means being removable; metal particle container means located in the halogenation chamber means; and access means for the reaction chamber means.

The invention also relates to an apparatus for producing metal coatings comprising a coating chamber means having carrier gas inlet means and gas outlet means and having substrate heating means for heating a substrate to metal sub-halide coating temperature; halogenation chamber means connected to the coating chamber means having a halogenation gas inlet means and having reaction heating means for causing reaction producing gaseous metallic sub-halides, the coating chamber means including a gas distribution means connected to the halogenation chamber means and the carrier gas inlet means; metal particle container means located in the halogenation chamber means; and access means for the reaction chamber means.

It has been found that good coatings with very favorable adhesion, structure and purity characteristics at good deposition rates, using deposition temperature less than 900° C., for example, 890° C., can be accomplished using metal sub-halides and properly controlling the flow rates and partial pressures of the reactants so as to promote favorable kinetic and thermodynamic conditions to promote acceptable reaction rates at the desired lower temperatures.

The metal coating of the present invention has shown good adhesion to a substrate and high cohesive strength. Without being limited to any particular theory for this discovery, these properties may result from using low temperatures in my coating process, which permits avoiding changes in a substrate material that adversely will affect properties and performance of the coating, including avoiding formation of a weak interlayer between the coating and the substrate and avoiding decarborization of the substrate.

In a preferred embodiment, titanium nitride coatings have been produced on a substrate by passing a controlled flow at about 400 volumes of hydrogen and about 10 volumes of hydrogen chloride over a bed of titanium metal particles heated to about 500° C., mixing 100 volumes of hydrogen and 150 volumes of nitrogen with the resulting hydrogen and titanium chloride and passing the gaseous mixture over a substrate heated to about 600° C.

Further improvements and modifications in the process include mixing the nitrogen with the hydrogen before passing the mixture over the titanium metal particles, and ammonia gas with the hydrogen and nitrogen mixture prior to introducing it to the substrate, but continuing the addition of ammonia gas for a limited period of time or for the duration of the coating cycle. Further improvement and modification are obtained by varying the pressure of the gaseous mixture passed over the substrate and maintaining the pressure of the mixed gas around the substrate at a pressure not more than about 4 millimeters of mercury. The selection of pressure is such as to produce Knudsen flow of the gas.

A thermodynamic analysis indicates that the lower halides (or sub-halides) of titanium and, in particular, titanium bichloride ($TiCl_2$), and titanium trichloride ($TiCl_3$) (sub-chlorides of titanium) facilitate a large reaction negative-free energy value, and accordingly, a greater potential for reaction involving the deposition of TiN by CVD at low temperatures. Indeed, the potential of titanium bichloride and titanium trichloride to react with nitrogen and hydrogen in a gaseous environment to deposit titanium nitride continues to increase right down to 0° K. Nonetheless, reaction kinetics can inhibit the deposition of titanium nitride at low temperatures. However, it has been found that the potential for the reaction of $TiCl_2$ and $TiCl_3$ to form titanium nitride can be tapped in a vapor environment containing nitrogen and hydrogen using reaction temperatures in the range of 250° to 850° C. Although even lower coating temperatures are possible, depending on deposition conditions used to overcome unfavorable kinetics, the temperatures used are intended to take full advantage of the favorable coating rates at a temperature which does not result in loss of temper or hardness in the tool substrates or item being coated, that is, a temperature which avoids changes in properties, either physical or chemical, of the substrate being coated. It is essential to keep the free energy of the reaction at or about a predetermined negative value in order that the temperature at which the reaction and the deposition of titanium nitride, in the case of titanium, takes place will be maintained in this temperature range.

In particular, the higher the equilibrium constant ($K_p$) of the reaction, the lower the reaction-free energy value will be, and accordingly, the partial pressure of the reactants and their flow rates are maintained at carefully controlled levels to permit the reaction to be carried out in the desired temperature range. In addition, the use of ammonia in the chemical vapor deposition stage assists in maintaining a higher equilibrium constant value and in enhancing the coating rates and quality.

Accordingly, titanium nitride is deposited by chemical vapor deposition by reacting titanium bichloride and/or titanium trichloride with hydrogen and nitrogen, and optionally some ammonia, at a suitable temperature that will not detrimentally affect substrate properties, and using flow rates which maintain partial pressures of the reactants, $TiCl_2$ and $TiCl_3$, at relatively high levels. The favorable thermodynamics and kinetic factors are thereby utilized for the deposition of titanium nitride at the desirable temperature.

Titanium bichloride and titanium trichloride, because of their thermodynamic characteristics in reaction, are important ingredients in the reaction for the deposition of titanium nitride. Titanium bichloride and titanium trichloride can be produced by the reduction of titanium tetrachloride, but such reduction yields quantities of both that are smaller than are required to conduct the deposition of TiN at suitably high rates.

Titanium bichloride and titanium trichloride can, of course, be obtained from other sources and simply be fed to a chemical vapor deposition chamber for the production of titanium nitride. Alternatively, a second embodiment of the invention involves a preliminary in situ step for the production of titanium sub-chlorides by passing hydrogen chloride over titanium metal. Such reaction will produce titanium bichloride, titanium trichloride, and titanium tetrachloride, and their relative proportions in the gas reaction mixture can be varied by manipulating the titanium metal chlorination conditions, such as temperature, or the partial pressures of hydrogen and the chlorinating agents, such as hydrogen chloride.

To increase the concentration of $TiCl_2$ and $TiCl_3$, which are less volatile than $TiCl_4$, in the gas reaction mixture, the in situ chlorination of titanium metal and the deposition of TiN in the two-stage process can also be conducted at low pressures. Reduction of pressure in the chlorination process facilitates vaporization of the sub-chlorides, which have a higher vaporization temperature than TiCl$_4$. This, in turn, permits chlorination to be performed at a lower temperature which, in turn, promotes production of the sub-chlorides. The use of low pressures in the vicinity of 4 millimeters of mercury pressure in the second stage of the process, that is the deposition of titanium nitride, also enhance the operation by improving the kinetic factors which favor deposition of titanium nitride on the substrate.

In low pressure CVD, effects such as free convection or the presence of boundary layers which restrict mass transport of reactive components to substrate materials, can be minimized or eliminated. As a consequence, a high degree of uniformity of composition and film thickness is possible on a substrate and from substrate-to-substrate using low pressure CVD. This aspect is especially important in large CVD reactors which may be densely loaded with substrate materials or articles to be coated, and in which changes in concentration of reactive components can arise downstream as a result of the coating reactions upstream. It appears that such effects can be minimized in low pressure CVD systems, because diffusion coefficients of the gas components are three to four orders of magnitude larger than in CVD systems operated at atmospheric pressures.

BRIEF DESCRIPTION OF THE DRAWINGS

The invention will be better understood with reference to examples which follow and with reference to the following figures, in which.

DESCRIPTION OF THE INVENTION

Figure 1:
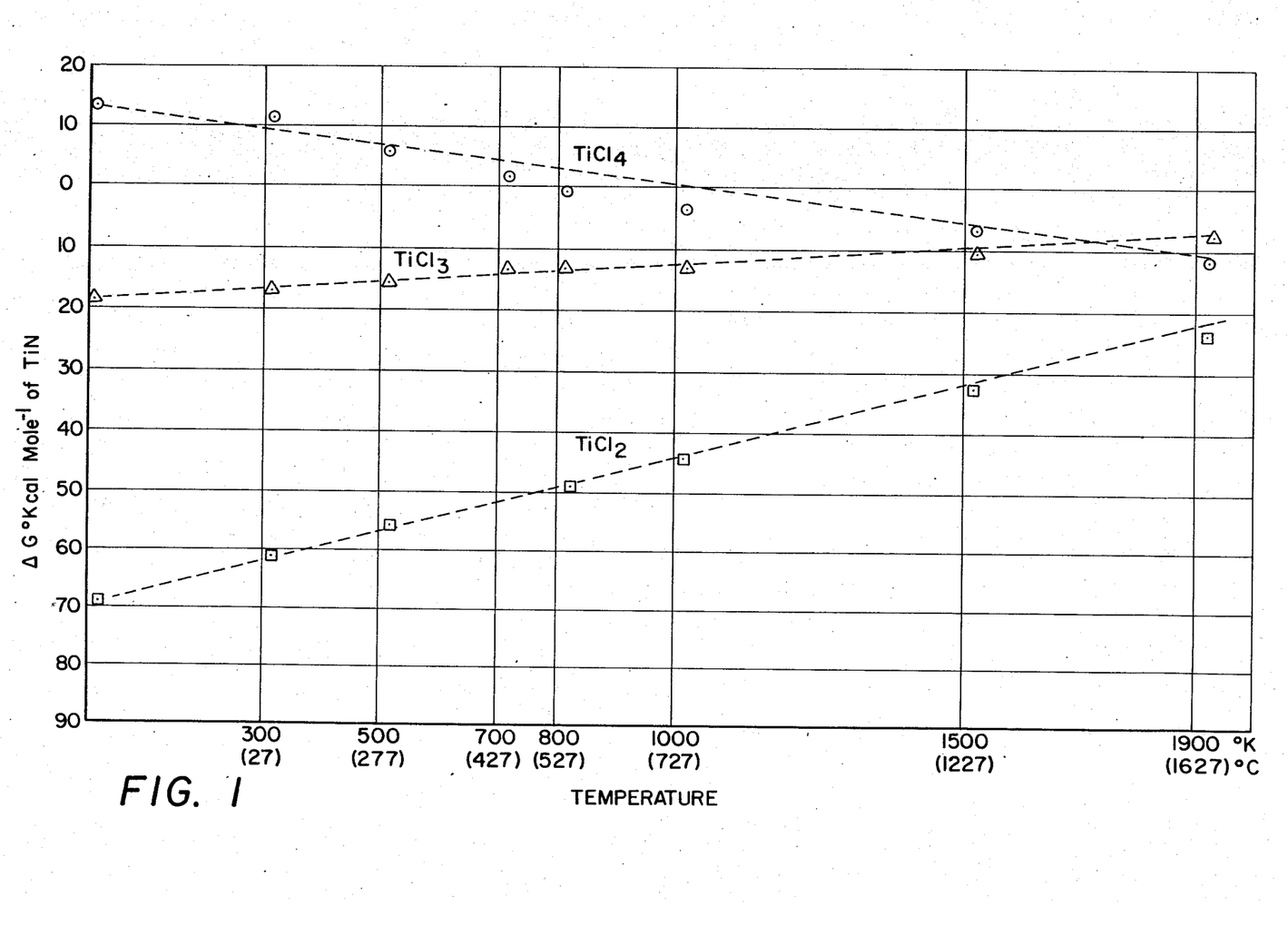
FIG. 1 shows the standard free energy versus temperature plots for the reactions of titanium tetrachloride, TiCl$_4$, titanium trichloride, TiCl$_3$, and titanium bichloride, TiCl$_2$, with nitrogen and hydrogen to deposit titanium nitride.

FIG. 1 includes a thermodynamic evaluation of the potential reactions available in a CVD coating process using titanium chlorides and indicates what reactant is preferable for reaction in any desired temperature range. In particular, FIG. 1 shows the standard free energy versus temperature plots for reactions 1, 2 and 3 below:

$$TiCl_{4(g)} + \tfrac{1}{2}N_{2(g)} + 2H_{2(g)} \rightarrow TiN_{(s)} + 4HCl_{(g)} \quad (1)$$

$$TiCl_{3(g)} + \tfrac{1}{2}N_{2(g)} + 3/2H_{2(g)} \rightarrow TiN_{(s)} + 3HCl_{(g)} \quad (2)$$

$$TiCl_{2(g)} + \tfrac{1}{2}N_{2(g)} + H_{2(g)} \rightarrow TiN_{(s)} + 2HCl_{(g)} \quad (3)$$

FIG. 1 indicates the standard free energy values ($\Delta G°$) for these reactions at reaction temperatures ranging from $-273°$ C. ($0°$ K.) to $1627°$ C. ($1900°$ K.). As indicated, the lower the free energy value the greater is the potential for reaction, although there is a point beyond which it is difficult to tap this potential due to unfavorable kinetics.

The plots in FIG. 1 disclose that whereas TiCl$_4$ can be effective in depositing TiN at temperatures of $717°$ C. ($1000°$ K.) and greater, TiCl$_3$ and TiCl$_2$ have potential for participating in the above reactions and depositing TiN at reaction temperatures down to $-273°$ C. ($0°$ K.). The potential for reaction of the latter compounds is due to the large negative free energy change accompanying reactions (2) and (3). The formation of TiN from TiCl$_2$ or TiCl$_3$ becomes more favorable as the temperature is decreased. Nonetheless, at $-273°$ C. (absolute $0°$ K.) any reaction would be very limited because of unfavorable kinetics. In addition, to trigger the reaction at any temperature requires manipulation of the physical process variables (that is, kinetic variables), such as pressures and flow rates, and the thermodynamic values, such as the equilibrium constants ($K_p$), a key constituent in the free energy value of the reaction. Varying kinetic factors and thermodynamic values will result in the reaction occurring at different temperatures. This will be better understood in part by reference to the factors which control the free energy value and, in particular, the relation between the free energy value and in the equilibrium value ($K_p$). Table I lists the equilibrium constants ($K_p$) for the reactions (1), (2) and (3) at temperatures in the range of $27°$ to $1627°$ C.

TABLE I

| Temperature °K. (°C.) | Reaction (1) $K_p$ | Reaction (2) $K_p$ | Reaction (3) $K_p$ |
|---|---|---|---|
| 300 (27) | $1.1 \times 10^{-8}$ | $1.7 \times 10^{12}$ | $1.4 \times 10^{44}$ |
| 500 (227) | $3.0 \times 10^{-3}$ | $7.3 \times 10^{6}$ | $1.2 \times 10^{24}$ |
| 700 (427) | $2.6 \times 10^{-1}$ | $3.9 \times 10^{4}$ | $8.2 \times 10^{15}$ |
| 800 (527) | 2.1 | $7.6 \times 10^{3}$ | $1.9 \times 10^{13}$ |
| 1,000 (727) | 1.57 | $6.7 \times 10^{2}$ | $4.0 \times 10^{9}$ |
| 1,500 (1227) | 10 | $3.3 \times 10$ | $5.1 \times 10^{4}$ |
| 1,900 (1627) | 24.8 | 8.8 | $5.0 \times 10^{2}$ |

$K_p$ and $G°_T$ relate as follows—(using reaction (3) for illustration purposes):

$$(K_p)_T = \frac{(P\text{-}HCl)^2 \times (P\text{-}TiN)}{P\text{-}TiCl_2 \times (P\text{-}N_2)^{\frac{1}{2}} \times P\text{-}H_2} \quad (4)$$

wherein P-HCl denotes the partial pressure of HCl at the reaction temperature T.

$$\Delta G°_T = -RT \ln (K_p)_T \quad (5)$$

where R is the universal gas constant, T is the reaction temperature, ln $(K_p)_T$ is the log to the base e of $(K_p)_T$.

As can be seen from equation (5), the free energy change ($\Delta G°_T$) is proportional to the negative of the equilibrium constant. Accordingly, the larger the equilibrium constant, the greater the negative value of free energy change and the greater the potential for reaction.

Therefore, from FIG. 1 using TiCl$_3$, it will be seen that for TiCl$_3$ to participate in reaction (2) at a temperature of about $500°$ C., the free energy value needs to be in the range of $-14$ Kcal/per mole of TiN. With these free energy and temperature values, equation (5) then determines a fixed value for $K_p$ at that temperature and from this series of partial pressure combinations for the reactants of the reaction are available. In addition, as discussed further below, it has been found beneficial to introduce ammonia into the reaction of TiCl$_2$ and TiCl$_3$ in reactions (2) and (3) to enhance the rate of deposition of TiN.

Process apparatus for carrying out TiN deposition will now be described and will be followed by examples of deposition of TiN coatings on substrates at the desired reaction temperatures by varying and manipulating the process variables.

Figure 2:
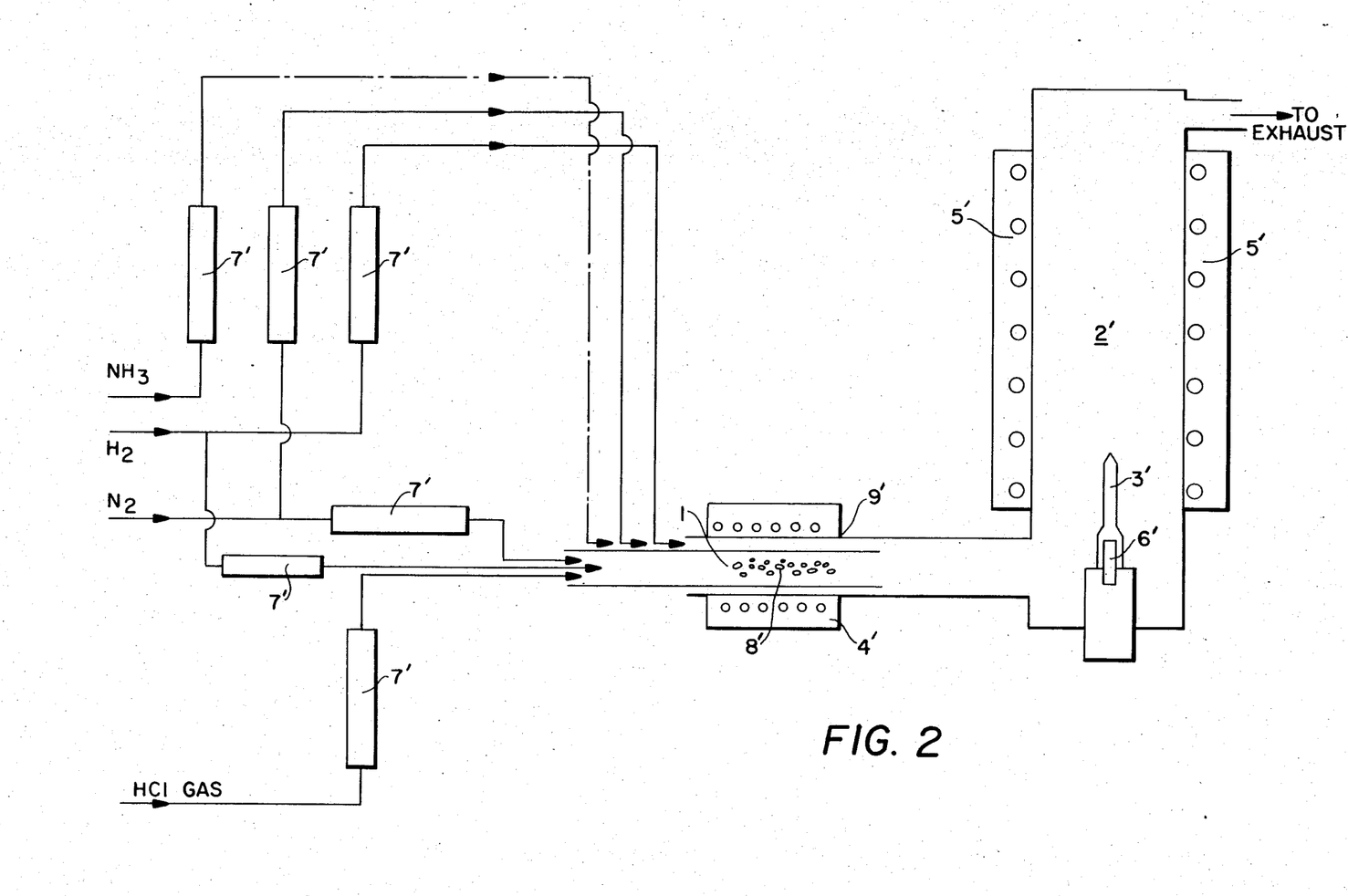
FIG. 2 shows schematically the two-stage process to carry out the chemical vapor deposition of titanium nitride at low temperatures utilizing the sub-chlorides of titanium metal, such as TiCl$_2$ and TiCl$_3$.

FIG. 2 shows a process apparatus which comprises two basic reaction chambers, a first chlorination chamber 1 upstream of and connected integrally with a coating chamber 2'. The chlorination chamber is heated by a conventional resistively heated furnace 4'. The tool substrate 3' is mounted within the coating chamber 2 and the chamber 2' is heated using conventional resistive heating means 5'. In addition and alternatively, the substrate 3' is independently heated in the coating chamber utilizing a conventional resistively heated cartridge heater 6'.

In chamber 1, the resistance heated furnace 4' heats titanium Ti metal chips from 150° to 1100° C. and HCl and H$_2$ are fed through flow meters 7', passed over the heated titanium 8' to produce TiCl$_2$ and TiCl$_3$ and hydrogen in accordance with the following resultant reactions:

$$X \, HCl_{(g)} + Ti_{(s)} \rightarrow TiCl_{(x)} + \frac{X}{2} \, H_2 \, (X = 2 \text{ or } 3) \qquad (6)$$

This reaction may also produce quantities of TiCl$_4$. However, the parameters of this reaction are controlled by using suitable combinations of reaction temperatures, and relative flow rates of H$_2$ and HCl to provide lower partial pressures of HCl, to steer the reaction towards predominant production of TiCl$_3$ and TiCl$_2$.

The TiCl$_2$ and TiCl$_3$ gases are carried from chlorination chamber 1 to coating chamber 2', to which hydrogen and nitrogen are fed through flow meters to foster the production of TiN by reactions (2) and (3). Before reaching chamber 2', the hydrogen and nitrogen are preheated by passing through the furnace 4' in an annular chamber about reaction chamber 1. The gases are all maintained at temperatures high enough to prevent the condensation of the halides by coupling the chlorination chamber 1 directly to the reaction chamber 2'. As discussed above, for the desired reactions (2) and (3) at a temperature in the range of 250° to 850° C., the value of Kp is fixed thermodynamically by formula (5) and a range of flow rates and partial pressure values can be determined. As will be appreciated, the flow rates chosen will affect the kinetics of the reaction.

Figure 3:
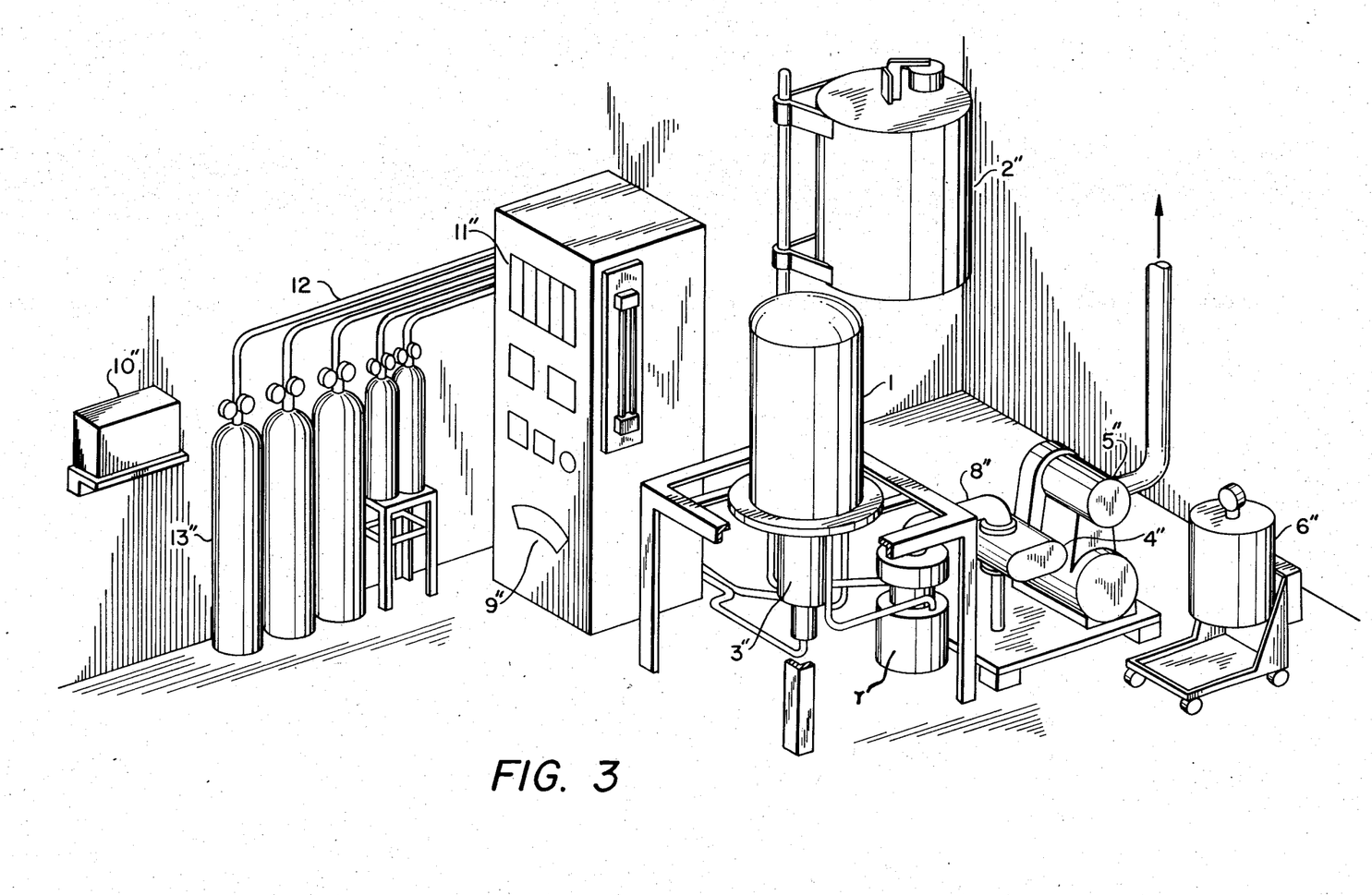
FIG. 3 shows a low pressure CVD reactor unit.

FIG. 3 shows an overview of a Low Pressure CVD (LPCVD) coating system. Gases including hydrogen, nitrogen, helium, ammonia and hydrogen chloride are fed along tubes 12 from standard bottled gas supplies 13' to borosilicate rotameter type flowmeters 11' which are used to monitor and control gas flows. From here, gases are flowed into the chlorination chamber 3' and the coating chamber 1 described in detail below. From the coating chamber, gases are exhausted through a conventional vacuum pumping train consisting of an inlet filter system 7', an electropneumatic valve 8, a roots type blower 4' and a mechanical piston pump 5' with an oil cleaning system 6'. The pumps are capable of maintaining system pressures down to 0.15 torr with total gas flow rates of 1 l/min. The coating chamber is heated by a conventional resistance furnace 2' which can be lowered or raised over the chamber. The system temperatures are monitored by appropriately placed thermocouples and are recorded by a digital data logger 10'. System pressures are monitored by a conventional analog pirani gauge 9'.

Figure 4:
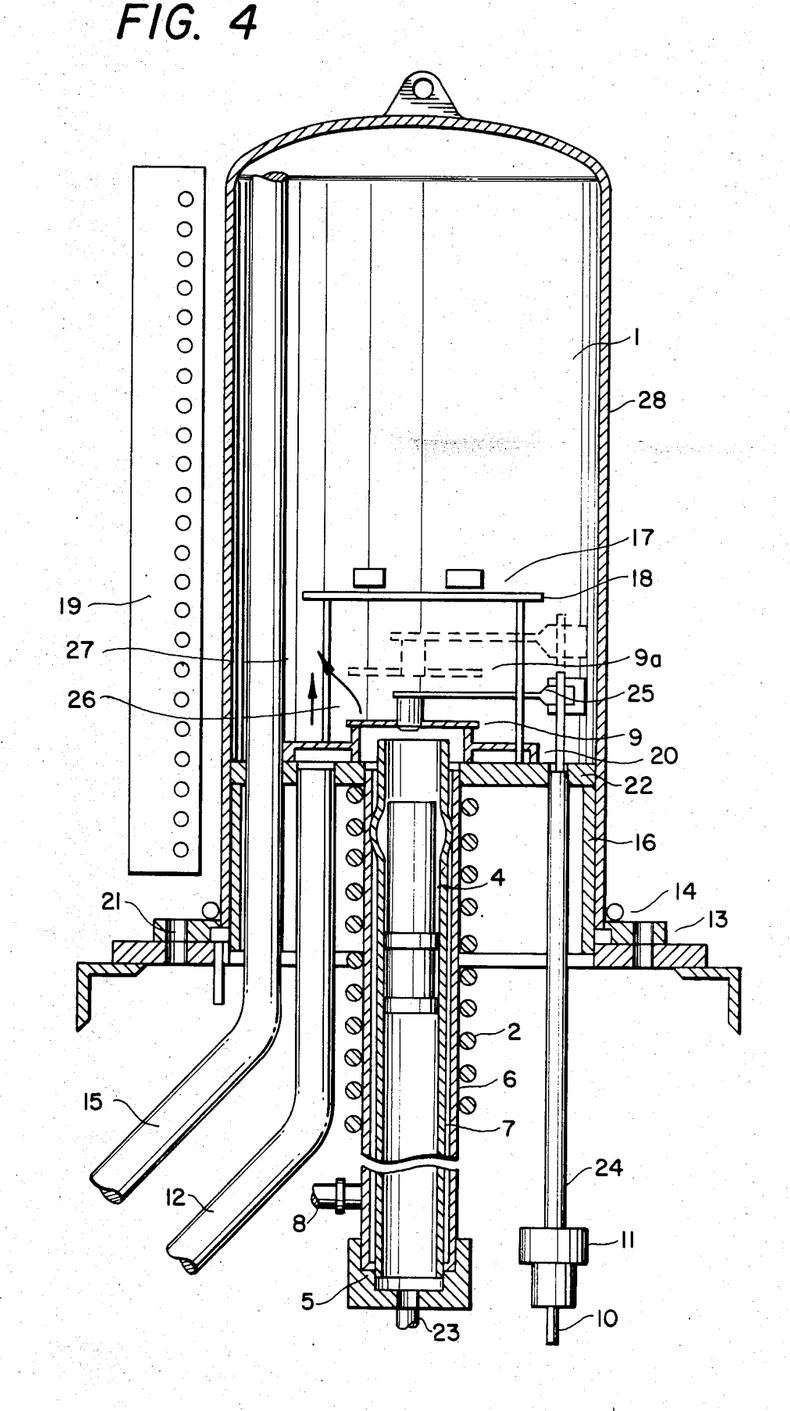
FIG. 4 shows a LPCVD hot wall reactor.

FIG. 4 shows a preferred embodiment of the LPCVD reactor. The reactor consists of a cylindrical coating chamber 1 in which parts to be coated 17 are placed, supported by a rack 18. The removable chamber top 28 is attached to the two level base plate assembly 13 by bolted O-ring sealed flanges 21 which are traced by water cooling tubes 14. This provides a gas tight seal necessary for low pressure operation. The chamber walls are heated by a conventional resistance furnace 19 to a temperature suitable for the coating process.

Nitrogen, hydrogen and ammonia are provided to the coating chamber 1 through gas inlet 12. These gases are distributed concentrically to the bottom of the chamber by an annular manifold 20 which is uniformly perforated on its top surface. Hydrogen chloride and hydrogen gases are introduced through the inlet 23 and pass through the tubular chlorination chamber 6 which is heated by a conventional resistance furnace 2 to the temperature necessary for the chlorination reactions described above. The metal walls of the chlorination chamber 6 are protected from the corrosive hydrogen chloride gas by a detachable quartz liner 7 which is attached to the tubular chamber 6 by an O-ring seal 5 between the metal tube and the quartz. Additional provision is made for passing an inert gas between the quartz liner 7 and the metal wall of the chamber 6 through port 8. Titanium particles are placed in a quartz boat 4 and reacted with the flow of hydrogen chloride to produce titanium chlorides, which are volatile at the temperatures and pressures used. These gases are introduced to the coating chamber 1 through the upper level 22 of the base plate 13 and through the center of the annular manifold 20 provided for the nitrogen, hydrogen, and ammonia gases. The chlorination chamber 6 is coupled as closely as possible to the base plate 13 to prevent condensation or decomposition of the volatile chlorides prior to reaching the coating chamber.

A movable disc 9 is provided as a means of isolating the chlorination chamber 6 from the coating chamber 1 before and after the coating cycle. The disc is attached by an arm 25 to a rod 10. This rod passes inside a tube 24 through the upper level 22 of the base plate 13 to an O-ring seal 11 which allows axial and rotational movement of the rod 10 without affecting the gas tightness of the system. By raising the rod 10, the movable disc 9 is raised to a position 9a above the manifold 20, allowing gases from the chlorination chamber 6 to flow into the coating chamber 1. The distance of the disc 9 above the manifold 20 can be adjusted to promote mixing between the chlorinated gases and the nitrogen, hydrogen and ammonia by diverting the flow of chlorinated gases 26 into the stream of the nitrogen, hydrogen and ammonia 27. By rotating the rod 10, the disc 9 may also be moved completely from the gas stream to provide unimpeded gas flow.

The upper level 22 of the base plate 13 has been elevated so that the location of the gas inlet 12, the manifold 20 and the exit of the chlorination chamber 6 are within the coating furnace 19. This feature is essential to prevent the condensation or decomposition of the volatile chlorides. The upper level 22 of the base plate 13 is supported by a thin cylindrical side wall 16 attached to the O-ring sealed flange 21. The thin side wall 16 prevents the transmission of heat and thermal stresses to the flange 21, allowing the use of conventional elastomer seals to achieve a gas tight seal.

After passing over the articles to be coated 17, the spent gases are exhausted through the exhaust tubes 15 (one only shown for clarity) from the top of the chamber. The exhaust tubes 15 pass through the upper level 22 of the base plate 13. Because all inlets and exhausts connect to the base plate, access to the interior of the coating chamber is conveniently accomplished by unbolting the flanged O-ring joint 21 and removing the chamber top 28.

Figure 4A:
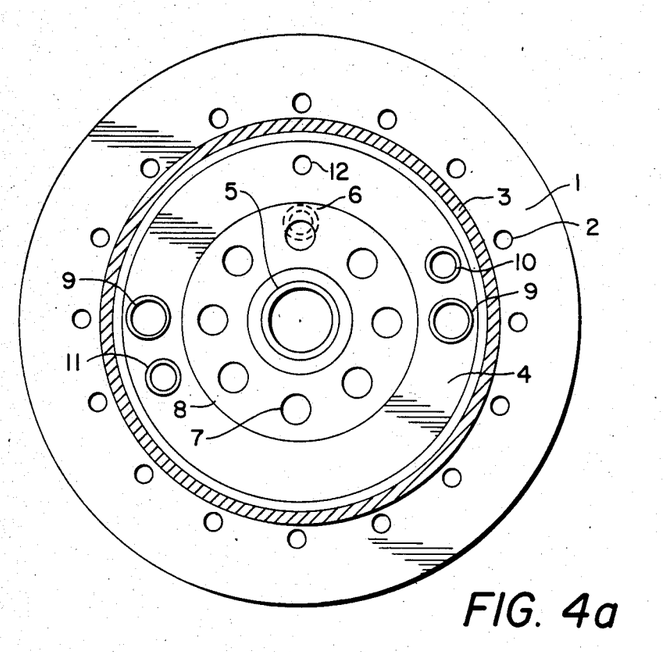
FIG. 4a shows a baseplate with "O" ring seal flange.

FIG. 4a shows a top view of the base plate indicating the arrangement of the inlets and exhausts.

The lower level flange 1 is provided with bolt holes 2 and an O-ring seal 3 to provide a gas tight seal to the coating chamber.

The chlorination gases are admitted through the centrally located inlet 5 on the upper level 4 of the plate. The nitrogen, hydrogen and ammonia are admitted through the inlet 6 and are concentrically distributed by the holes 7 in a manifold 8 surrounding the chlorination inlet 5. The spent gases are exhausted through two exhaust tubes 9 located on either side of the chamber which extend to the top of the chamber. The rod used to acutate the isolation disc extends through a tube 10 adjacent to the exhaust tube 9. Similar ports are provided for monitoring temperature 11 and pressure 12 within the chamber using conventional thermocouples and pirani gauges.

Figure 5:
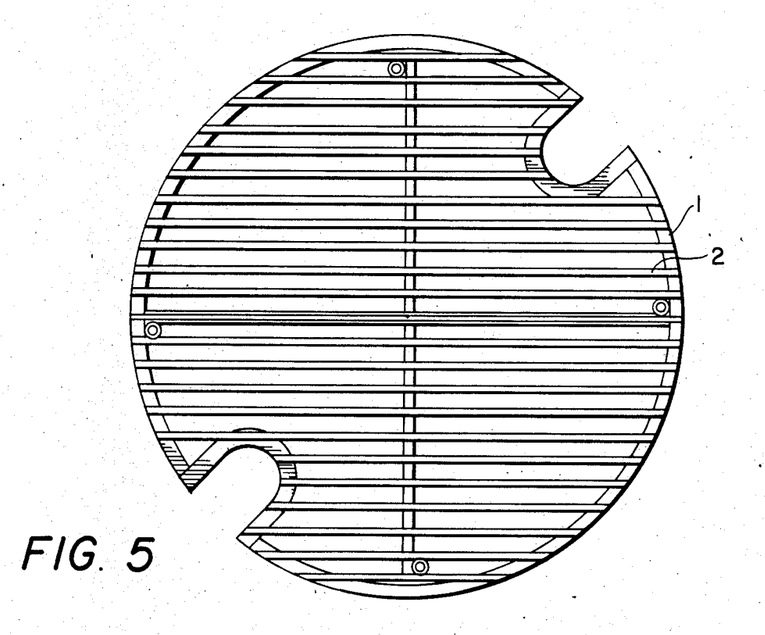
FIG. 5 shows a substrate rack.

FIG. 5 shows the rack used to support the substrates being coated. The rack consists of a wire grid 1 supported by a tubular frame 2. This design allows free circulation of the coating gases around the substrate.

Figure 6:
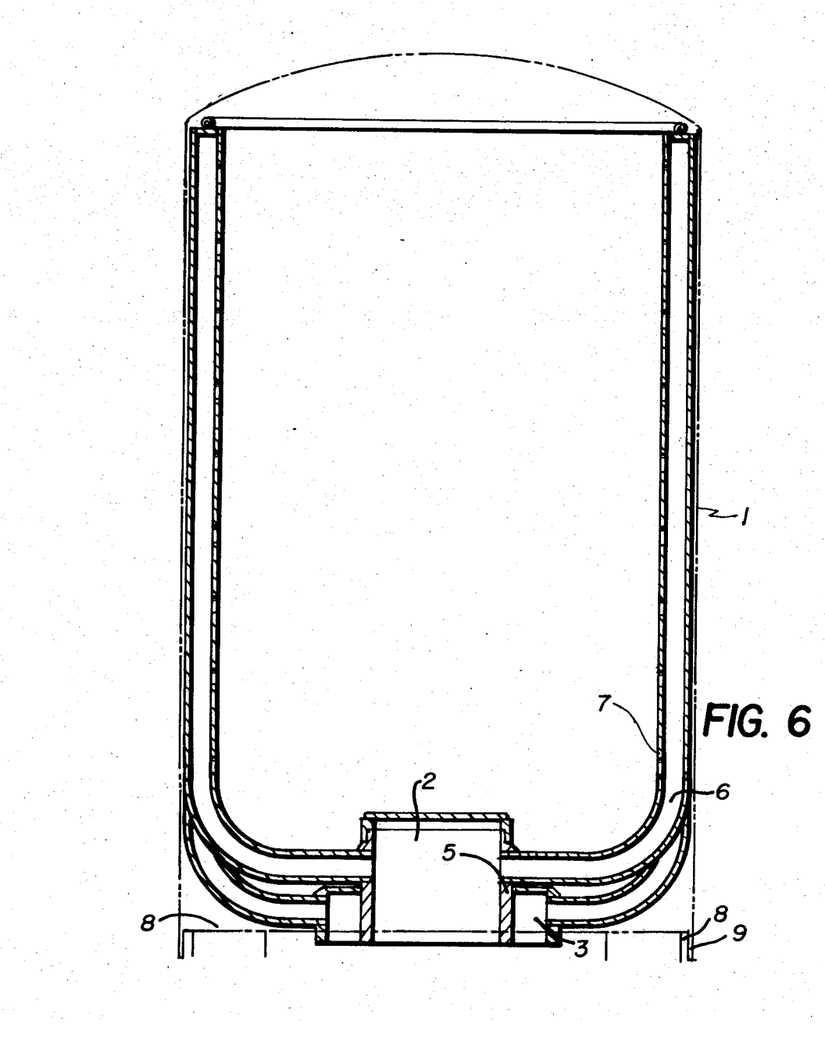
FIG. 6 shows a side view of the reactor unit including a gas distributor.
Figure 6A:
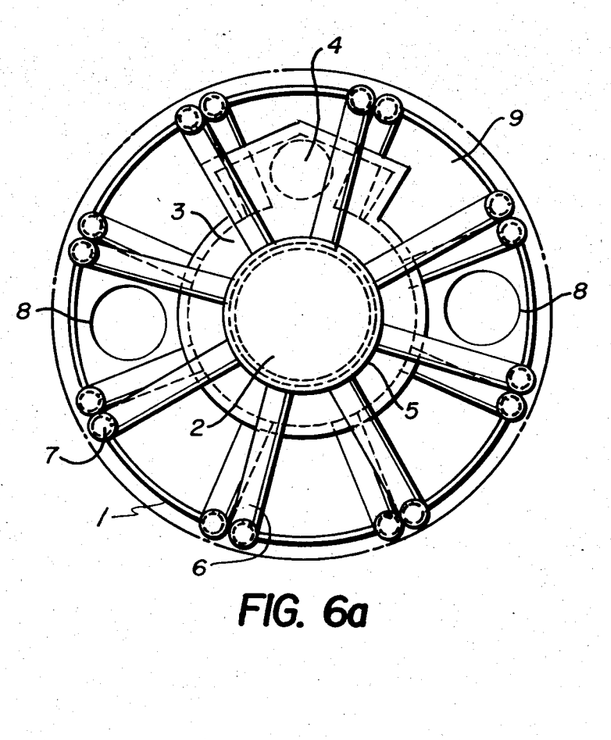
FIG. 6a shows a top view of the reactor unit with the gas distributor.

FIGS. 6 and 6a show a further embodiment of the invention in which a distributor is used to provide uniform concentrations of the gaseous reactants throughout the coating chamber. Those elements of the invention below the upper level of the base plate shown in FIG. 4 are identical in all respects, except for those elements pertaining to the isolating mechanism which has been eliminated in this embodiment.

As in the previous embodiment, the chloride gases exit the chlorination chamber through the center of the upper level of the base plate 9, while the nitrogen, hydrogen and ammonia are admitted through an adjacent tube. In this embodiment, the chloride gases enter a central cylindrical cavity 2 and the nitrogen, ammonia and hydrogen enter a concentrically located annular cavity 3. The two cavities are separated by a septum 5 which prevents mixing of the two gas streams. From each cavity, a set of tubes 6 extends radially and bends 90° running up the inside of the coating chamber wall 1. The gases exit the tubes 6 from a series of holes 7 in the vertical portion of the tubes. The holes 7 are sized and spaced to provide an even supply and constant mixture of the two gas streams to all levels of the chamber. The spent gases are exhausted from two ports 8 in the upper level of the base plate. The entire distributor assembly, including cavities 2 and 3 and tubes 6 may be removed from the base plate for access to the chlorination chamber.

By introducing fresh reactants to each level of the chamber, the use of a distributor allows coatings of uniform thickness and quality to be obtained throughout the chamber. Without the distributor, the composition of the coating gas will change as the active species are reacted to form the coating. At the exhaust, there will therefore be a much lower concentration of reactive species and the coating will therefore be poorer.

EXAMPLES

All the following examples are carried out on equipment of the type generally illustrated in FIG. 2 and produced TiN coatings and, except where indicated otherwise, the equipment is operated at 1 atm pressure.

TABLE II

| No. | Coating Conditions | | |
|---|---|---|---|
| | Coating Temperature (°C.) CHamber 2 | Flow Rates (ml/min) | |
| | | H$_2$ | N$_2$ |
| 1 | 500 | 50 | 40 |
| 2 | 500 | 100 | 100 |
| 3 | 500 | 50 | 100 |
| 4 | 700 | 100 | 50 |
| 5 | 640 | 100 | 100 |
| 6 | 600 | 100 | 100 |
| 7 | 575 | 30 | 50 |
| 8 | 575 | 50 | 50 |
| 9 | 522 | 30 | 50 |
| 10 | 380 | 30 | 50 |
| 11 | 510 | 30 | 50 |
| 12* | 600 | 150 | 100 |
| 13 | 600 | 100 | 230 |
| 14 | 600 | 100 | 430 |
| 15 | 600 | 100 | 330 |
| 16 | 600 | 100 | 230 |
| 17 | 600 | 100 | 350 |
| 18 | 600 | 100 | 350 |
| 19 | 600 | 100 | 350 |
| 20 | 600 | 100 | 350 |
| 21 | 800 | 100 | 350 |

*Deposition conducted at a total pressure of 4.1 mm.

TABLE III

| No. | Chlorination Conditions | | |
|---|---|---|---|
| | Reaction Temperature (°C.) | Flow Rates (ml/min) | |
| | | H$_2$ | HCl |
| 1 | 500 | 150 | 5 |
| 2 | 500 | 200 | 8.5 |
| 3 | 750 | 300 | 10 |
| 4 | 800 | 50 | 10 |
| 5 | 800 | 300 | 15 |
| 6 | 850 | 300 | 15 |
| 7 | 800 | 200 | 10 |
| 8 | 800 | 200 | 10 |
| 9 | 800 | 200 | 10 |
| 10 | 800 | 200 | 10 |
| 11 | 800 | 200 | 10 |
| 12* | 600 | 150 | 5 |
| 13 | 600 | 600 | 12 |
| 14 | 600 | 1200 | 12 |
| 15 | 600 | 900 | 12 |
| 16 | 600 | 800 | 8 |
| 17 | 600 | 800 | 8 |
| 18 | 600 | 600 | 8 |
| 19 | 600 | 1200 | 8 |
| 20 | 600 | 400 | 8 |
| 21 | 650 | 800 | 8 |

*Chlorination conducted at a total pressure of 4.1 mm.

It has been further found that the quality of the deposit and the rate of deposition of TiN in the above CVD reactions can be improved by the addition of ammonia to the gas reaction mixture. In the examples which follow, substrate materials, such as copper, stainless steel and nickel-based super alloy, are independently heated in the coating chamber by mounting them on a cartridge heater. The temperature of the cartridge heater was controlled using a temperature controller. Temperatures of the copper, stainless steel and nickel-based super alloy substrate materials are monitored using a separate thermocouple attached to their surfaces. The walls of the coating chamber are maintained at a constant temperature using the resistively heated furnace arrangement, as in the previous examples in Tables II and III. It is, of course, always important to have the coating chamber and its walls at a temperature high enough to keep the metal subhalides in the gas phase and avoid any condensing-out at the walls.

A coating period of one hour and an operating pressure of 1 atm is used for all the coating runs summarized in Table IV. In all of the examples given in Table IV the same chlorination step in chamber 1 is conducted at 500° C. and at flow rates of 10 ml/min of HCl and 400 ml/min of $H_2$. Details of the deposition conditions used are given in Table IV.

TABLE IV

| | Coating Conditions | | | | | |
|---|---|---|---|---|---|---|
| | Temperature (°C.) | | Flow Rates (ml/min) | | | Quality of TiN |
| No. | Coating Chamber | Substrate | $H_2$ | $N_2$ | $NH_3$ | Coatings |
| 1 | 400 | 600 ± 10 | 100 | 150 | — | A thin TiN coating was deposited |
| 2 | 400 | 600 ± 10 | 200 | 50 | 50 | Good, about ½ to 1 m thick |
| 3 | 400 | 600 ± 10 | 200 | 50 | 50* | Excellent, about ½ to 1 m thick |
| 4 | 425 | 600 ± 10 | 200 | 50 | 5 | Good, about ½ to 1 m thick |

*In No. 3, ammonia was allowed to flow only for the first five minutes of the total one hour duration of the coating run, after which it was turned off.

From the previous examples relating to the use of ammonia, it can be seen from the results given in Table IV that ammonia is not only effective in enhancing the deposition of TiN thermodynamically, as a comparision of the examples 1 with 4 shows, but also improves the kinetics of the deposition of TiN, as a comparison of the examples 3 with 1, 2 and 4 illustrates.

The examples shown in Table V illustrate the advantages of pressure reduction in the chamber where a coating is occurring and in the chlorination process. It will be seen in Table V, with a pressure in the coating chamber of 2 millimeters of mercury and flow rates, as shown, and the addition of ammonia, good coatings are obtained. Table V also illustrates, in the third example, the effect of introducing the nitrogen in the first stage of the process during chlorination. Unexpectedly, the nitrogen does not result in nitrides being retained in the first reaction, but permits a better control. In the third example, with a flow rate of 20 milliliters of hydrogen and 6 milliliters of HCl and 20 milliliters of $N_2$ with the chamber pressure of 1.5 millimeters of mercury, a suitable coating could be obtained.

While Table V illustrates examples of operation at reduced pressure, it has been found that introduction of nitrogen in the first stage is also practical at atmospheric pressures.

A detailed description of the procedure used in coating, with particular reference to the first example of Table V, follows.

The apparatus is partially evacuated through the exhast with all inlet gas flows shut off. The whole apparatus is flushed with a gas, such as hydrogen or helium, which is not reactive with other materials. Flushing is continued to rid the apparatus of water vapor and oxygen.

The temperature of the titanium is raised to 500° C. by furnace 4' and the temperature of substrate 3' is raised to 600° C. by heating means 5'. These temperatures are measured by suitably located thermocouples.

The pressure within the apparatus is reduced. Hydrogen and hydrogen chloride at volume ratio of 40/12 is now permitted to flow over the titanium and hydrogen, nitrogen and ammonia in the volume ratio of 20/10/3 are mixed with the resulting gases from the first stage.

The mixed gases flow into chamber 2' and a total pressure of about 2 mm Hg is maintained for a suitable period of time, one hour for example.

At the end of the cycle the apparatus is permitted to cool down, the gas flow reverted to inert gas and the workpiece removed. Preferably, the stage 1 portion of the apparatus is at least partially sealed off before the chamber 2' is opened to atmosphere, thus simplifying the flushing process in the next cycle.

Operation of the low pressure CVD system is described below in connection with a TiN coating treatment example. The tool materials or articles to be coated are degreased and cleaned before being placed on the substrate rack located in the low pressure CVD reactor.

The reactor is next attached to the flange with the "O" seal ring using bolts, as shown in FIGS. 4 and 4a, and evacuated by opening the electropneumatic valve, followed by back filling with an inert gas, such as helium. This procedure is repeated several times to remove any traces of air or moisture. After final evacuation, the chlorination and coating chamber furnaces are activated. After temperatures of 550° and 700° C. are reached, the metal disc used to isolate the chlorination chamber, is moved away. The flow of gases, as provided below, is started through the chlorination and low pressure CVD coating chambers.

Flow of gases through the chlorination chamber (at 700° C.):
Hydrogen: 100 ml/min
Hydrogen Chloride: 150 ml/min

TABLE V

| | Chlorination Conditions (Stage 1) | | | | | Coating Conditions (Stage 2) | | | |
|---|---|---|---|---|---|---|---|---|---|
| No. | Temp. °C. | $H_2$ ml/min | HCl ml/min | $N_2$ | Press. mm Hg | Temp. °C. | $H_2$ ml/min | $N_2$ | $NH_3$ | Comments |
| 1 | 500 | 40 | 12 | — | 2 | 600 | 20 | 10 | 3 | Good adherent coating of TiN, gold color, about .5 microns thick. No detectable chlorine. |
| 2 | 500 | 25 | 6 | — | 1 | 600 | 20 | 10 | — | Similar to above. |
| 3 | 500 | 20 | 6 | 20 | 1.5 | 600 | 20 | — | — | Similar to above, but thinner. Coating rate slightly reduced. |

Hydrogen (for ventilation): 50 ml/min.
Flow of gases through the coating chamber (at 550° C.):
Hydrogen: 100 ml/min
Nitrogen: 50 ml/min
Ammonia: 225 ml/min
Total Pressure: 0.06 mm of mercury.

At the end of the coating treatment, the flow of gases is discontinued and the heating furnaces are switched off. The metal disc is placed on top of the quartz chlorination tube to isolate it from the low pressure CVD coating chamber. The reactor is partially filled back with an inert gas, such as helium, and allowed to cool to room temperature before opening to the atmosphere and removal of the coated articles.

It will be understood that the above disclosure has dealt with TiN coatings only by way of example. The low temperature deposition principles disclosed above apply equally to the deposit of zirconium nitride, hafnium nitride, carbonitrides of titanium, zirconium and hafnium nitrides and carbides and carbonitrides of vanadium, niobium and tantalum (the vanadium sub-group of metals) and of chromium molybdenum and tungsten (the chromium sub-group of metals). In fact, the invention applies to those metals of Group IVB, Group VB and Group VIB and to combinations of those metals, because the metals have a variable valency and it is possible to use those valencies which have the lower free energy of formation when forming metallic halides. In the case of carbide coatings, the reactant gases in the deposition reaction are a hydrocarbon, such as $CH_4$, $H_2$, and the metal sub-halide. In the case of carbonitride coatings, the reactant gases in the deposition reaction are hydrocarbon, such as $CH_4$, $H_2$ and $N_2$ and/or $NH_3$, and the metal sub-halide. The substrates mentioned in this disclosure are exemplary, not exclusive. Other known substrates can be coated using the method and apparatus of this invention. Other known inert gas can be used.

While I have shown and described one embodiment in accordance with the present invention, it is understood that the same is not limited thereto, but is susceptible of numerous changes and modifications as known to those skilled in the art, and I, therefore, do not wish to be limited to the details shown and described herein, but intend to cover all such changes and modifications as are encompassed by the scope of the appended claims. For example, the low pressure CVD apparatus described above could also be used to conduct CVD at atmospheric pressure with conventional modifications and, of course, without the vacuum pumps.

I claim:

1. Coating apparatus comprising:
    coating chamber means having inlet means and outlet means and having heating means;
    halogenation chamber means within and connected to the coating chamber means having inlet means and reactor heating means;
    means for isolating the halogenation chamber means from the coating chamber means, the isolation means being removable;
    particle container means in the halogenation chamber means; and
    access means for the coating chamber means.

2. Apparatus for producing metal cotaings comprising:
    coating chamber means having carrier gas inlet means and gas outlet means and having substrate heating means for heating a substrate to metal sub-halide coating temperature;
    halogenation chamber means within and connected to the coating chamber means having a halogenation gas inlet means and having reaction heating means for causing rection producing gaseous metallic sub-halides;
    isolation means for interrupting the connection between the reaction chamber and the halogenation chamber, the isolation means being removable;
    metal particle container means located in the halogenation chamber means; and
    access means for the reaction chamber means.

3. The apparatus according to claim 2, wherein the halogenation chamber means being below the coating chamber means.

4. The apparatus according to claim 2, wherein the metal particle container means having metal particles from Group IVB, VB or VIB of the Periodic Table of the Elements.

5. The apparatus according to claim 4, wherein the metal particles being titanium, zirconium or hafnium.

6. The apparatus according to claim 2, wherein the coating chamber means including flow control means.

7. The apparatus according to claim 2, wherein the halogenation chamber means including flow control means.

8. The apparatus according to claim 2, wherein the halogenation chamber means including pressure control means.

9. The apparatus according to claim 2, wherein the coating chamber means including a rack means for supporting a substrate.

10. The apparatus according to claim 2, wherein the coating chamber means including a vacuum pumping means.

11. The apparatus according to claim 10, wherein the vacuum pumping means including a piston pump, blower, filter and scrubber.

12. The apparatus according to claim 10, wherein the vacuum pumping means being isolated from the coating chamber means by an electropneumatic valve.

13. The apparatus according to claim 2, wherein the isolation means being a metal disc.

14. The apparatus according to claim 13, wherein the metal disc being movable axially along the major axis of the halogenation chamber.

15. The apparatus according to claim 2, wherein the halogenation chamber means including a quartz glass liner tube.

16. The apparatus according to claim 2, wherein the coating chamber means and the halogenation chamber means are cylindrical.

17. The apparatus according to claim 16, wherein the chamber means are axially aligned.

18. Apparatus for producing metal coatings comprising:
    coating chamber means having carrier gas inlet means and gas outlet means and having substrate heating means for heating a substrate to metal sub-halide coating temperature;
    halogenation chamber means within and connected to the coating chamber means having a halogenation gas inlet means and having reaction heating means for causing reaction producing gaseous metallic sub-halides;

the coating chamber means including a gas distribution means connected to the halogenation chamber means and the carrier gas inlet means;

metal particle container means located in the halogenation chamber means; and access means for the reaction chamber means.

19. The apparatus according to claim 18, wherein the coating chamber means and gas distribution means are axially aligned.

20. The apparatus according to claim 18, wherein the gas distribution means comprises a pair of distribution pipes, one of said pair of pipes being connected to the halogenation chamber means while the other pipe being connected to the carrier gas inlet means.

21. The apparatus according to claim 20, wherein the distribution pipes are perforate.

22. The apparatus according to claim 20, wherein the apparatus includes several pairs of distribution pipes.

23. The apparatus according to claim 20, wherein the halogenation chamber means and carrier gas inlet means are separated by a septum.

24. The apparatus according to claim 23, wherein the halogenation chamber means and carrier gas inlet means coaxial.

* * * * *